United States Patent
Christianson et al.

(10) Patent No.: US 9,459,533 B2
(45) Date of Patent: Oct. 4, 2016

(54) POLYMER COMPOSITION, PHOTORESIST COMPRISING THE POLYMER COMPOSITION, AND COATED ARTICLE COMPRISING THE PHOTORESIST

(71) Applicants: Dow Global Technologies LLC, Midland, MI (US); Rohm and Haas Electronic Materials LLC, Marlborough, MA (US)

(72) Inventors: Matthew D. Christianson, Midland, MI (US); Matthew M. Meyer, Midland, MI (US); Owendi Ongayi, Marlborough, MA (US)

(73) Assignee: DOW GLOBAL TECHNOLOGIES LLC, Midland, MI (US)

( * ) Notice: Subject to any disclaimer, the term of this patent is extended or adjusted under 35 U.S.C. 154(b) by 79 days.

(21) Appl. No.: 13/926,004

(22) Filed: Jun. 25, 2013

(65) Prior Publication Data

US 2014/0004464 A1    Jan. 2, 2014

Related U.S. Application Data

(60) Provisional application No. 61/665,801, filed on Jun. 28, 2012.

(51) Int. Cl.
*G03F 7/039* (2006.01)
*C08F 14/18* (2006.01)
*G03F 7/00* (2006.01)

(52) U.S. Cl.
CPC ........... *G03F 7/0397* (2013.01); *C08F 14/185* (2013.01); *G03F 7/00* (2013.01)

(58) Field of Classification Search
CPC ........................... G03F 7/0395; G03F 7/0397
See application file for complete search history.

(56) References Cited

U.S. PATENT DOCUMENTS

| | | | |
|---|---|---|---|
| 5,283,304 A * | 2/1994 | Nakabayashi | C08F 214/186 526/245 |
| 7,276,323 B2 | 10/2007 | Feiring et al. | |
| 7,358,027 B2 | 4/2008 | Ito | |
| 7,402,626 B2 | 7/2008 | Maeda et al. | |
| 2002/0042016 A1* | 4/2002 | Yoon | G03F 7/0392 430/270.1 |
| 2003/0228537 A1* | 12/2003 | Yoon et al. | 430/270.1 |
| 2003/0232940 A1* | 12/2003 | Komoriya et al. | 526/242 |
| 2004/0248039 A1 | 12/2004 | Sounik et al. | |
| 2010/0173245 A1 | 7/2010 | Wang et al. | |
| 2011/0184143 A1* | 7/2011 | Helou et al. | 528/128 |

FOREIGN PATENT DOCUMENTS

| | | |
|---|---|---|
| JP | 2005121857 A | 5/2005 |
| JP | 2007016081 A | 1/2007 |
| TW | 593368 B | 6/2004 |

OTHER PUBLICATIONS

Cramail et al (chapter 8 "Cationic Polymerization" from Materials Science ant Technology A comprehensive Treatment , Cahn et al eds, 1999 pp. 231-267, copyright WILEY-VCH-Verlag GmbH, D-69469 Weinheim (Federal Republica of Germany).*

CAS Registry No. 275354-10-4, downloaded from SciFInder database on Apr. 12, 2015, one page.*

English translation with added annotations from Japanese document of JP 2005-121857 a machine translation from AIPN Japan Patent Office National Center for Industrial Property Information and Training, generated Apr. 12, 2015 and annotated by examiner Hamilton in selected places with original structures from JP document, 131 pages.*

(Continued)

*Primary Examiner* — Cynthia Hamilton
(74) *Attorney, Agent, or Firm* — Cantor Colburn LLP

(57) ABSTRACT

A copolymer comprises the polymerized product of a dissolution-rate controlling monomer having the formula (I), an acyclic vinyl ether monomer of the formula (II), and a cyclic vinyl ether monomer of the formula (III):

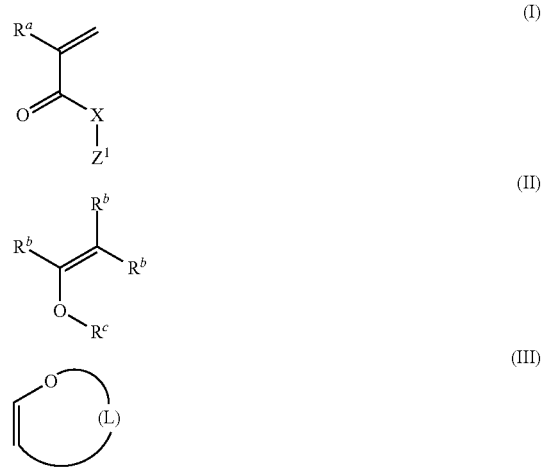

wherein $R^a$, $R^b$, $R^c$, L, X, and $Z^1$ are defined herein. A photoresist composition comprising the copolymer is described, as is an article coated with the photoresist composition, and a method of forming an electronic device using the photoresist composition.

10 Claims, 1 Drawing Sheet

(56) References Cited

OTHER PUBLICATIONS

Full English translation of JP 2005-121857a obtained after USPTO determined how to obtain such from from AIPN Japan Patent Office National Center for Industrial Property Information and Training, generated Jul. 7, 2015 with no changes except to add page numbers. (this is translation obtained using Chrome after modification of AIPN website) 103 pages.*

Hiroshi Ito et al., "Radical Copolymerization of 2-Trifluoromethylacrylic Monomers. II. Kinetics, Monomer Reactivities, and Penultimate Effect in Their Copolymerization with Norbornenes and Vinyl Ethers" J. Poly, Sci Part A: Polym Chem 42: 1478-1505, 2004; 28 pages.

Ito et al.; "Radical Copolymerization of 2-Trifluoromethylacrylic Monomers. II. Kinetics, Monomer Reactivities, and Penultimate Effect in Their Copolymerization with Norbornenes and Vinyl Ethers"; J Poly Sci; Pt A: Poly Chem; vol. 42; pp. 1478-1505; 2004.

* cited by examiner

POLYMER COMPOSITION, PHOTORESIST COMPRISING THE POLYMER COMPOSITION, AND COATED ARTICLE COMPRISING THE PHOTORESIST

BACKGROUND

Design rules for advanced generation microlithography (i.e., beyond 193 nm immersion lithography and into next generation optics such as e-beam, X-ray, and extreme ultraviolet (EUV) lithography operating at a very short wavelength of 13.4 nm) are trending toward smaller and smaller dimensions, for example, 30 nm and below. In general, depth of focus (DOF) necessarily decreases with higher resolution due to the higher numerical aperture (NA) and therefore resist thickness also decreases commensurate with the smaller and smaller feature sizes. With narrower linewidths and thinner resist films, increasingly sensitive materials which provide improved resolution are needed.

Backbone fluorination of resist polymers, as an alternative to fluorinating the pendant or leaving groups of a polymer, can improve EUV photon absorbing properties in the polymer without altering leaving group or other properties. However, introducing fluorine atoms near a monomer's polymerizable group affects the reactivity and polymerization behavior of the monomer.

Trifluoromethacrylates (TFMA) are monomers that, when polymerized, incorporate trifluoromethyl groups along the polymer backbone. However, such monomers do not undergo homopolymerization, or copolymerization between different trifluoromethacrylates, readily. Copolymerization of trifluoromethacrylates with electron rich monomers, including norbornenes and vinyl ethers, is possible under common polymerization conditions. Polymerization with acyclic vinyl ether comonomers typically generates high molecular weight polymers under standard radical polymerization conditions; such copolymers may not be soluble in casting solvents typical of photoresist formulations. Ito and coworkers, however, (Ito, H.; Okazaki, M.; Miller, D. C. *J. Polym. Sci., Part A: Polym. Chem.* 2004, 42, 1478) have prepared polymers with significantly lower molecular weights by employing cyclic vinyl ethers. However, copolymers of cyclic vinyl ethers with trifluoromethacrylates may have high dissolution rate.

There remains a need for polymers with fluorinated backbones for use in EUV photoresists which have improved sensitivity, as well as high resolution.

STATEMENT OF INVENTION

The above and other deficiencies of the prior art may be overcome by a copolymer comprising the polymerized product of a dissolution-rate controlling monomer having the formula (I), an acyclic vinyl ether monomer of the formula (II), and a cyclic vinyl ether monomer of the formula (III):

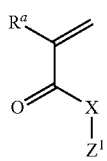

(I)

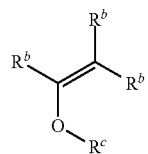

(II)

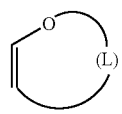

(III)

wherein $R^a$ is H, F, $C_{1-10}$ alkyl, or $C_{1-10}$ fluoroalkyl, provided $R^a$ is $C_{1-10}$ fluoroalkyl for at least one instance of the monomer of formula (I), X is O or NR wherein R is H, a $C_{1-10}$ alkyl, or a $C_{6-10}$ aryl, $Z^1$ is a $C_{1-20}$ alkylene, $C_{3-20}$ cycloalkylene, $C_{6-20}$ arylene, or $C_{7-20}$ aralkylene, wherein $Z^1$ optionally comprises an aromatic or non-aromatic hydroxyl, sulfonate, sulfonic acid, sulfonamide, sulfonimide, carboxylic acid, ester, carbonate, amide, or a combination comprising at least one of the foregoing, each $R^b$ is independently H or a $C_{1-20}$ alkyl, $C_{3-20}$ cycloalkyl, $C_{6-20}$ aryl, or $C_{7-20}$ aralkyl, wherein $R^b$ optionally comprises F, —C(=O)—O—, or a combination comprising at least one of the foregoing, $R^c$ is a $C_{1-20}$ alkyl, $C_{3-20}$ cycloalkyl, $C_{6-20}$ aryl, or $C_{7-20}$ aralkyl, wherein $R^c$ optionally comprises an F, —O—, —S—, NR—, —C(=O)—O—, or —OH, wherein R is H, $C_{1-10}$ alkyl, $C_{3-10}$ cycloalkyl, $C_{6-10}$ aryl, or $C_{6-10}$ aralkyl, and L is a containing $C_{1-20}$ alkylene, $C_{3-20}$ cycloalkylene, $C_{6-20}$ arylene, or $C_{7-20}$ aralkylene, and L optionally comprises F, —OH, or a combination comprising at least one of the foregoing.

A photoresist composition comprises the copolymer and a photoacid generator, wherein the photoacid generator is an additive or is incorporated into the copolymer.

A coated substrate, comprises (a) a substrate having one or more layers to be patterned on a surface thereof; and (b) a layer of the photoresist composition over the one or more layers to be patterned.

A method of forming an electronic device, comprises (a) applying a layer of the photoresist composition on a substrate; (b) patternwise exposing the photoresist composition layer to activating radiation; and (c) developing the exposed photoresist composition layer to provide a resist relief image.

BRIEF DESCRIPTION OF THE DRAWINGS

The foregoing and other objects, features, and advantages of the invention are apparent from the following detailed description taken in conjunction with the accompanying drawings in which.

DETAILED DESCRIPTION OF THE INVENTION

Figure 1:
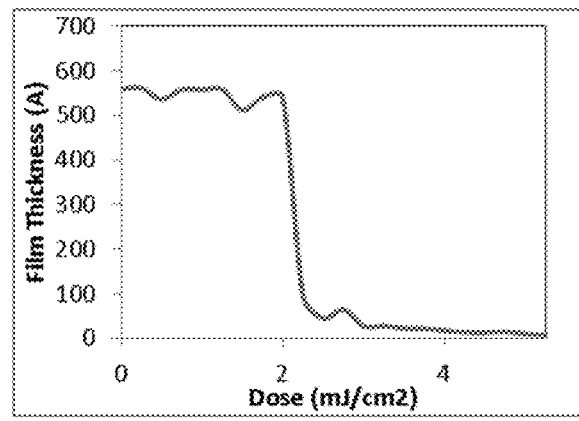
FIG. 1 shows an extreme ultraviolet (EUV) contrast curve as a plot of measured film thickness (nm) versus exposure dose (in mJ/cm²) for an exemplary copolymer.

Disclosed herein is a novel copolymer based on the polymerized product of a fluorinated alpha-beta unsaturated ester (such as halogenated (meth)acrylic acid based structures), an acyclic vinyl ether, and a cyclic vinyl ether. As used herein, "cyclic" means that the vinyl ether moiety is incorporated within a ring system and connected into the ring by two bonds, either as an endo or exo moiety, and "acyclic" means the vinyl ether moiety is present as a substituent group connected to a ring system only by a single bond. Furthermore, "fluorinated" means containing one or more fluorine atoms, and broadly includes within this description "perfluorinated" where greater than 75%, specifically greater than 80%, and more specifically greater than 90% of the available hydrogen atoms in an organic group have been replaced by fluorine atoms. A copolymer including the three monomers has been prepared by a radical polymerization method, which can provide at least a partial alternating structure to the copolymer, including randomized subunits having alternating sequences of the halogenated (meth)acrylic acid structures with the cyclic vinyl ethers and acyclic vinyl ethers. As used herein, "(meth)acrylic" and "(meth)acrylate" mean both acrylic and methacrylic, and acrylate and methacrylate, respectively. Additional monomers may be included with the three monomers to provide tetrapolymers, pentapolymers, and higher monomer-content polymers. Further, by varying the proportion of acyclic and cyclic vinyl ether, the molecular weight of the polymer may also be adjusted where compositional variation in the vinyl ether component does not affect the polymer structure-property relationship.

The copolymer thus comprises the polymerized product of an alpha-beta unsaturated ester. The alpha-beta unsaturated ester is preferably a dissolution-rate controlling monomer having the formula (I):

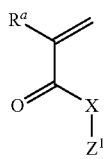

(I)

wherein, in formula (I), $R^a$ is H, F, $C_{1-10}$ alkyl, or $C_{1-10}$ fluoroalkyl, provided $R^a$ is $C_{1-10}$ fluoroalkyl for at least one instance of this monomer. Preferably, $R^a$ is a $C_{1-4}$ fluoroalkyl group. Exemplary groups $R^a$ include $CF_3$, $C_2F_5$, $C_3F_7$, $C_4F_9$, and isomers of these. Combinations of different monomers of formula (I) can be used which differ in groups $R^a$, provided at least one group $R^a$ is fluorinated. For example, combinations of monomers of formula (I) can be used where $R^a$ is $CF_3$ and H, $CH_3$, or a combination of these groups.

Also in formula (I), X is O or NR where R is H, a $C_{1-10}$ alkyl, or a $C_{6-10}$ aryl. Exemplary such groups R include methyl, ethyl, n- or isopropyl, butyl, phenyl, and the like. Preferably, X is O.

$Z^1$ in formula (I) is a $C_{1-20}$ alkyl, $C_{1-20}$ alkylene, $C_{3-20}$ cycloalkyl, $C_{3-20}$ cycloalkylene, $C_{6-20}$ aryl, $C_{6-20}$ arylene, $C_{7-20}$ aralkyl, or $C_{7-20}$ aralkylene group, wherein $Z^1$ optionally further contains an aromatic or non-aromatic hydroxyl, sulfonate, sulfonic acid, sulfonamide, sulfonimide, carboxylic acid ester, carbonate, amide, or a combination comprising at least one of the foregoing. As used herein, containing an ester means having an ester group within the aforementioned groups, either as a pendant unit, as a linking group to connect the group to another substructure, or incorporated in the structure of the group as a lactone. It will be appreciated that the carbonyl carbon of the ester group is included in the carbon count of the group. Also as used herein, "cycloalkylene" includes monocyclic (such as cyclopentylene, cyclohexylene, and the like), polycylic (such as cyclopentylene-cyclohexylene, bis-cyclohexylene, tris-cyclohexylene, and the like), and fused polycyclic (such as norbornylene, adamantylene, and the like). Where the groups $Z^1$ are alkylene, cycloalkylene, arylene, or aralkylene, the groups include, for example, cyclohexylene-based groups including mono or dihexafluoroalcohol-substituted cyclohexylene, mono or dihexafluoroalcohol-substituted hydroxycyclohexyl, hexafluoroalcohol substituted norbornyl; hydroxyphenyl, hydroxynaphthyl, mono or dihexafluoroalcohol-substituted phenylene, and mono or dihexafluoroalcohol-substituted hydroxyphenyl. Where the groups $Z^1$ are alkyl, cyclohexyl, aryl, or aralkyl, the groups include but are not limited to, for example, methyl, ethyl, propyl, isopropyl, butyl, isobutyl, t-butyl, 2-methylbutyl, methylcyclopentyl, ethylcyclopentyl, methylcyclohexyl, ethylcyclohexyl, hydroxyadamantyl, methyladamantyl, ethyladamantyl, isopropylphenyl, isopropylnaphthyl, and the like. Substituent groups contained in $Z^1$ include, for example, F, —OH, —$C_6R_5$OH, —C(CF$_3$)$_2$—OH, —C(=O)—O—, —O—C(=O)—O—, —O—C(=O)—, —O—SO$_2$—O—, —SO$_2$—O—, and —NR—SO$_2$— where each R is H or is fluorinated or non-fluorinated and is $C_{1-10}$ alkyl, $C_{3-10}$ cycloalkyl, $C_{6-10}$ aryl, or $C_{7-10}$ aralkyl.

Preferably, the dissolution rate controlling monomer of formula (I) is a base-soluble monomer, or an acid deprotectable monomer which is base soluble after deprotection. It will be understood that monomers having base soluble groups include those having 1,1,1,3,3,3-hexafluoro-2-hydroxy propyl groups (sometimes referred to herein as hexafluoroalcohol groups and abbreviated HFA), aromatic hydroxyl groups, carboxylic acids, sulfonic acids, and fluoroalkyl sulfonamides as base soluble functional groups, Similarly, an acid-deprotectable monomer is one containing any group that is cleaved in the presence of acid. Preferably, such acid-deprotecting groups protect a base soluble group such as those discussed above. Such groups include but are not limited to tertiary alkyl esters such as t-butyl esters, methylcyclopentyl, ethylcyclopentyl, and 2-methyl-2-adamantyl; tertiary benzyl esters such as 2-phenyl-2-propyl; and tertiary alkyloxy carbonyl groups such as tert-butyloxycarbonyl groups (abbreviated t-BOC groups).

Useful such monomers of formula (I) include as base soluble monomers, base soluble cycloaliphatic monomers of formula (I-a) and base soluble aromatic monomers of formula (I-b). Useful acid-deprotectable monomers include those of formula (I-c) and those of formula (I-b) having acid cleavable groups such as carboxylic acid esters. It will be understood that a combination comprising at least one of the foregoing monomers may be used.

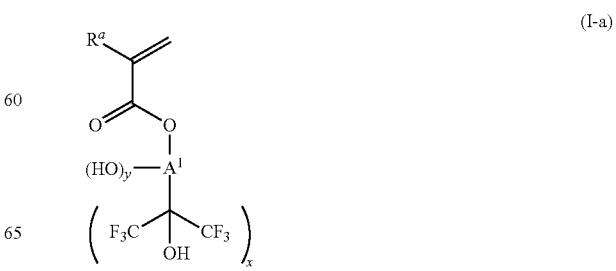

(I-a)

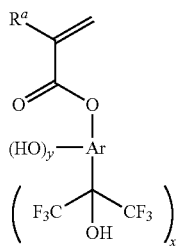
(I-b)

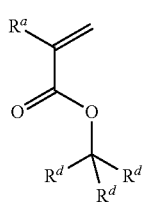
(I-c)

In each of formulas (I-a), (I-b), and (I-c), $R^a$ is H, F, $C_{1-10}$ alkyl, or $C_{1-10}$ fluoroalkyl, provided $R^a$ is $C_{1-10}$ fluoroalkyl for at least one of monomer (I-a), (I-b), or (I-c).

In formula (I-a), $A^1$ is a linear or branched $C_{1-20}$ alkylene, $C_{3-20}$ cycloalkylene, $C_{5-20}$ polycycloalkylene, or fused $C_{6-20}$ polycycloalkylene. $A^1$ optionally comprises F, —C(=O)—O—, or a combination comprising at least one of the foregoing. Also in formula (I-a) x is an integer of from 1 to 3 and y is 0 or 1.

In formula (I-b), Ar is $C_{6-20}$ arylene, or $C_{7-20}$ aralkylene. Ar optionally comprises F, —C(=O)—O—, or a combination comprising at least one of the foregoing. Also in formula (I-b), x is an integer of from 0 to 3, y is 0 or 1, and x+y>0.

In formula (I-c), each $R^d$ is independently $C_{1-20}$ alkyl, $C_{3-20}$ cycloalkyl, $C_{6-20}$ aryl, or $C_{7-20}$ aralkyl, and each $R^d$ is only commonly attached to a single carbon atom or at least one $R^d$ is further bonded to an adjacent $R^d$ to form a cyclic structure.

The base soluble monomers of formulas (I-a) and (I-b) include those of formulas (I-a-1) ad (I-b-1), respectively:

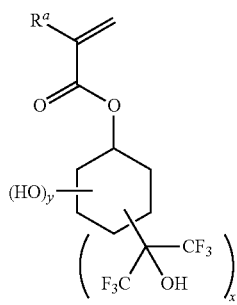
(I-a-1)

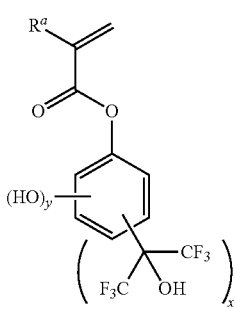
(I-b-1)

wherein each $R^a$ is independently $C_{1-10}$ fluoroalkyl. In formula (I-a-1), x is an integer of from 1 to 3 and y is 0 or 1. In formula (I-b-1), x is an integer of from 0 to 3, y is 0 or 1, and x+y>0.

Exemplary base soluble monomers include:

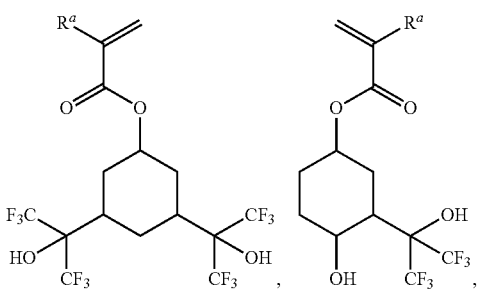

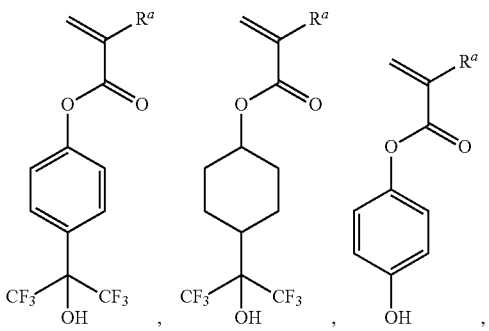

-continued

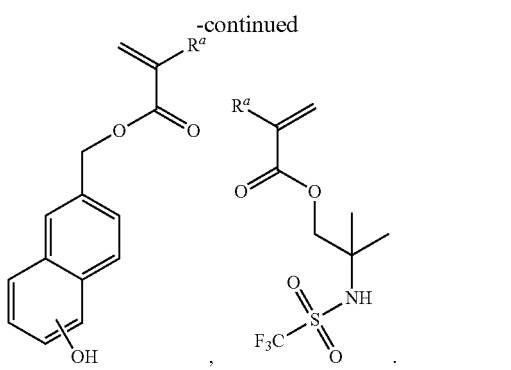

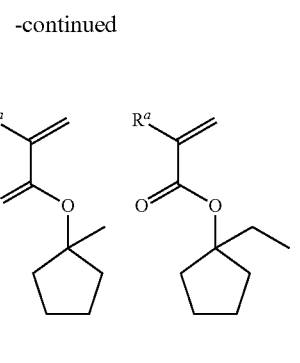

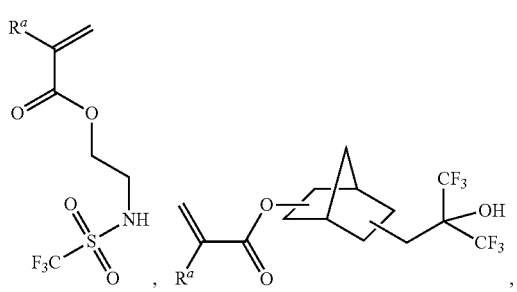

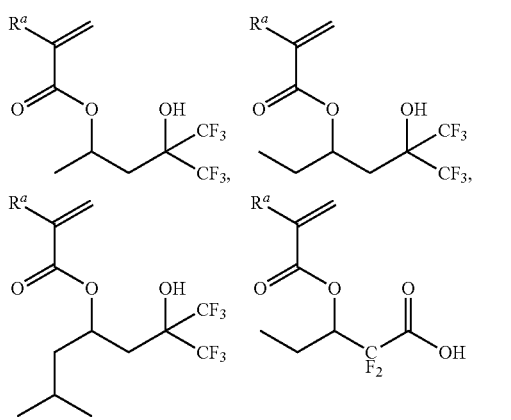

or a combination comprising at least one of the foregoing, wherein $R^a$ is $C_{1-6}$ fluoroalkyl, or where a combination of monomers is used, $R^a$ is H, F, CN, $C_{1-6}$ alkyl, or $C_{1-6}$ fluoroalkyl, provided $R^a$ is $C_{1-6}$ fluoroalkyl for at least one monomer.

Exemplary acid deprotectable monomers include the following monomers:

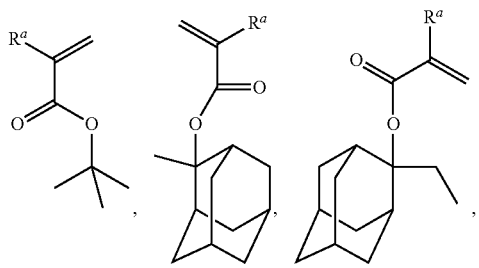

-continued

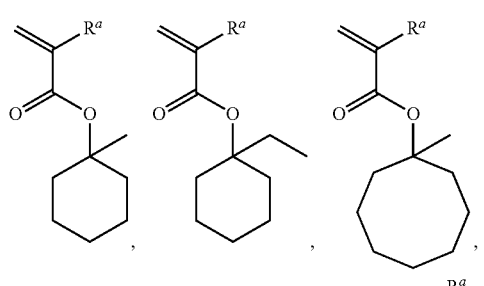

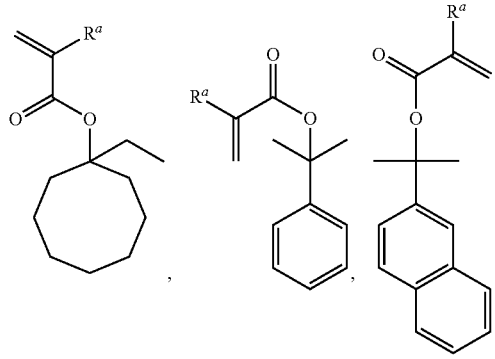

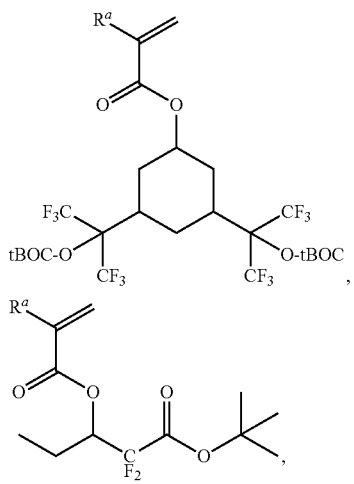

or a combination comprising at least one of the foregoing, wherein $R^a$ is $C_{1-6}$ fluoroalkyl, or where a combination of monomers is used, $R^a$ is H, F, CN, $C_{1-6}$ alkyl, or $C_{1-6}$ fluoroalkyl provided $R^a$ is $C_{1-6}$ fluoroalkyl for at least one monomer.

The copolymer further includes an acyclic vinyl ether of formula (II):

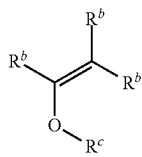
(II)

In formula (II), each $R^b$ is independently H or $C_{1-20}$ alkyl, $C_{3-20}$ cycloalkyl, $C_{6-20}$ aryl, or $C_{7-20}$ aralkyl, wherein $R^b$ optionally comprises F, —C(=O)—O—, or a combination comprising at least one of the foregoing. Exemplary groups $R^b$ include H, $CH_3$, $C_2H_5$, $C_3H_7$, $CH_2OH$, $CH_2CH_2OH$, $CH_2CH(OH)CH_3$, cyclopentyl, cyclohexyl, adamantyl, norbornyl, phenyl, benzyl, and the like. Preferably, $R^b$ is H.

Also in formula (II), $R^c$ is a $C_{1-20}$ alkyl, $C_{3-20}$ cycloalkyl, $C_{6-20}$ aryl, or $C_{7-20}$ aralkyl, wherein $R^c$ optionally contains an F, —O—, —S—, NR—, —C(=O)—O—, or —OH, where R is H, $C_{1-10}$ alkyl, $C_{3-10}$ cycloalkyl, $C_{6-10}$ aryl, or $C_{6-10}$ aralkyl. Note that an ester moiety may be an acyclic ester, or a cyclic (lactone) moiety. Exemplary groups $R^c$ include, but are not limited to, $CH_3$, $C_2H_5$, $C_3H_7$, $CH_2OH$, $CH_2CH_2OH$, $CH_2CH(OH)CH_3$, $CF_3$, $CH_2CF_3$, cyclopentyl, cyclohexyl, adamantyl, norbornyl, ethoxynapthyl, ethoxyanthracenyl, ethoxybutyrolactone, benzothiophene, phenyl, benzyl, and the like. Preferably, $R^c$ is $CH_3$, $C_2H_5$, $C_3H_7$, cyclohexyl, adamantyl, ethoxynapthyl, ethoxyanthracenyl, ethoxybutyrolactone, benzothiophene, or benzyl.

Exemplary acyclic vinyl ethers include the following:

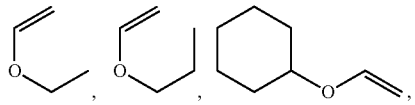

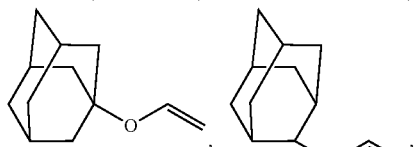

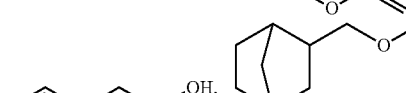

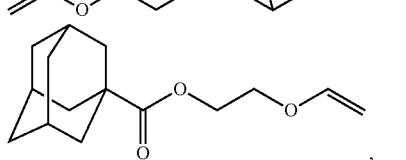

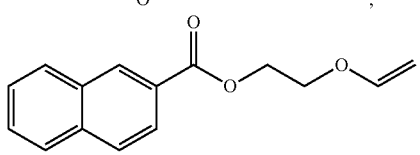

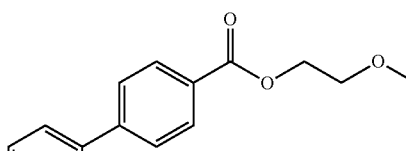

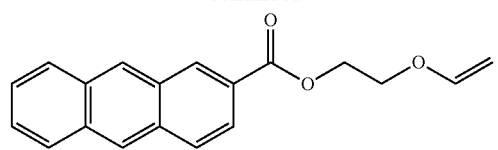

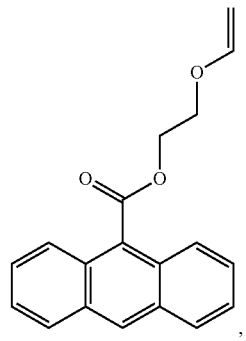

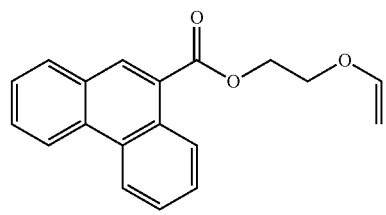

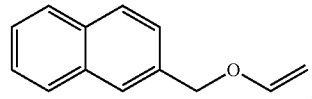

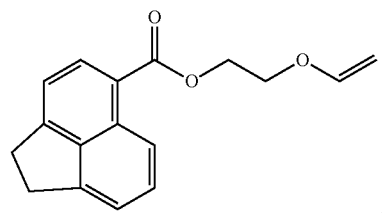

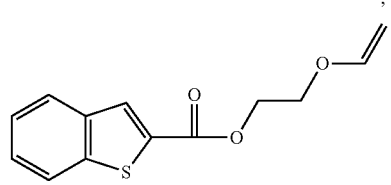

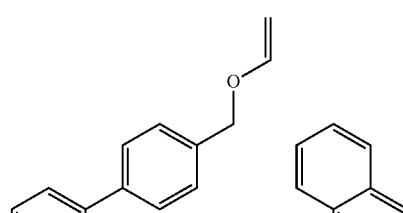

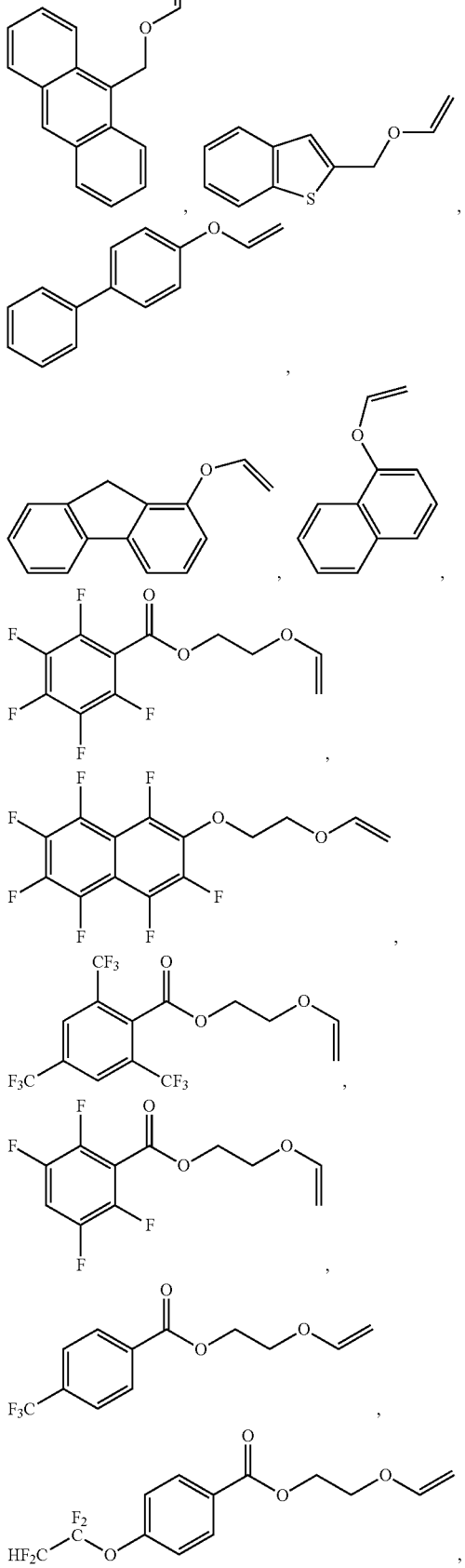

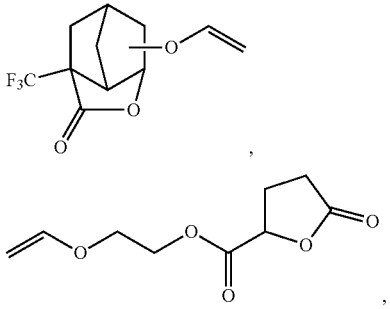

or a combination comprising at least one of the foregoing.

The copolymer further includes a cyclic vinyl ether of formula (III):

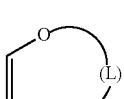

(III)

wherein in formula (III), L is a $C_{1-20}$ alkylene, $C_{3-20}$ cycloalkylene, $C_{6-20}$ arylene, or $C_{7-20}$ aralkylene. L optionally comprises F, —OH, or a combination comprising at least one of the foregoing.

Preferably, the cyclic vinyl ether monomer has the formula (III-a):

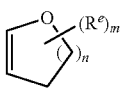

(III-a)

wherein each $R^e$ is independently $C_{1-20}$ alkyl, $C_{3-20}$ cycloalkyl, $C_{6-20}$ aryl, or $C_{7-20}$ aralkyl, and each $R^e$ is separate or at least one $R^e$ is bonded to an adjacent $R^e$ to form a cyclic structure. Also in formula (III-a), m is an integer of from 0 to 2n+2, and n is an integer of from 0 to 10.

Exemplary cyclic vinyl ether monomers include the following:

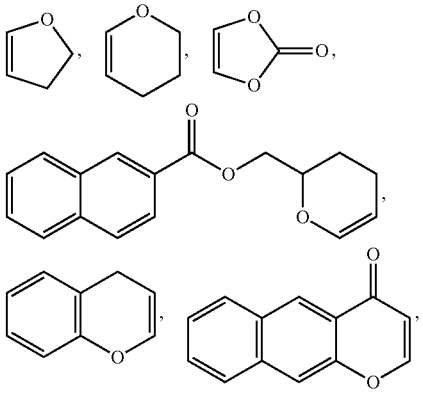

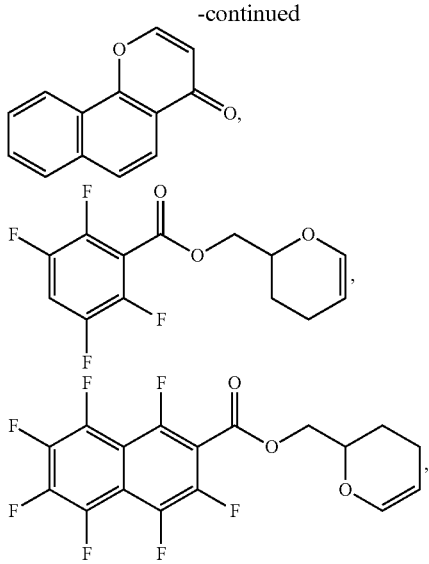

or a combination comprising at least one of the foregoing.

The copolymer can be prepared by known radical polymerization methods. A general method of making the copolymer thus includes reacting a monomer of formulas (I), (II), and (III) with a polymerization initiator. The monomers may be combined with each other and the initiator and heated, or may be fed into the polymerization separately, or combined and fed into the solvent. The initiator may be added at once or fed concurrently. The polymerization may be performed as a solution polymerization, or as an aqueous-based polymerization such as an emulsion polymerization.

Preferably, the polymerization is carried out in solution, and the copolymer is isolated from the polymerization by precipitation, spray drying with solvent recovery, or the like. Any solvent compatible with the monomers and initiator may be used without limitation for the polymerization reaction. Useful initiators include, for example, radical initiators such as peroxy initiators, diazo initiators, and the like. Exemplary initiators include t-butyl hydroperoxide, benzoyl peroxide, t-butylperoctoate, azo initiators such as VAZO 52, VAZO 64, VAZO 67, VAZO 88, available from DuPont, and Wako V-601, V-65, available from Wako Chemical, and similar initiators.

The copolymer disclosed herein has a weight average molecular weight (Mw) of less than 75,000 g/mol, preferably 1,000 to 50,000 g/mol, preferably 1,200 to 25,000 g/mol, preferably 1,500 to 15,000 g/mol, and more preferably 2,000 to 10,000 g/mol. The copolymer also has a number average molecular weight (Mn) of less than 75,000 g/mol, preferably 1,000 to 50,000 g/mol, preferably 1,200 to 25,000 g/mol, preferably 1,500 to 15,000 g/mol, and more preferably 2,000 to 10,000 g/mol. In addition, the copolymer has a polydispersity (PDI; Mw/Mn) of less than or equal to 3, preferably less than or equal to 2.5, more preferably less than or equal to 2, and still more preferably less than or equal to 1.8.

It has been further found, that replacing a portion of the cyclic vinyl ether with an acyclic vinyl ether in amounts up to 20 mol % of the total monomer charge can be used to adjust the molecular weight of the resultant polymer, and hence to adjust the dissolution rate of the resultant polymer with only small variation in composition. In addition, it has been found that use of a fluorinated monomer (e.g., a trifluoromethacrylate) provides enhanced absorbance and hence sensitivity of the copolymers to extreme ultraviolet (EUV) wavelengths. Preferably, the copolymers have a percent transmittance of EUV radiation of less than or equal to 80%, specifically less than or equal to 75%, and preferably less than or equal to 70% at a film thickness of 40 nm. Also preferably, the copolymers have a percent transmittance of EUV radiation of greater than 50%, preferably greater than 55%, and preferably greater than 60%, at a film thickness of 40 nm.

The copolymer is used to prepare a photoresist. The photoresist may include, alternatively or in addition to the photoacid generating monomer, a non monomeric PAG compound; optionally an additional polymer; additives including for example a photo-destroyable base, and a surfactant. Other additives, such as dissolution rate inhibitors, sensitizers, additional PAGs, etc. may also be included. The photoresist components are dissolved in solvent for dispense and coating.

The photoresist may include a photo-destroyable base. Inclusion of base materials, preferably the carboxylate salts of photo-decomposable cations, provides a mechanism for neutralization of acid from the acid decomposable groups, and limits the diffusion of the photogenerated acid, to thereby provide improved contrast in the photoresist.

Photo-destroyable bases include photo-decomposable cations, and preferably those also useful for preparing PAGs, paired with an anion of a weak (pKa>2) acid such as, for example, a $C_{1-20}$ carboxylic acid. Exemplary such carboxylic acids include formic acid, acetic acid, propionic acid, tartaric acid, succinic acid, cyclohexylcarboxylic acid, benzoic acid, salicylic acid, and other such carboxylic acids. Photo-destroyable bases include cation/anion pairs of the following structures, and the cation is triphenylsulfonium or one of the following:

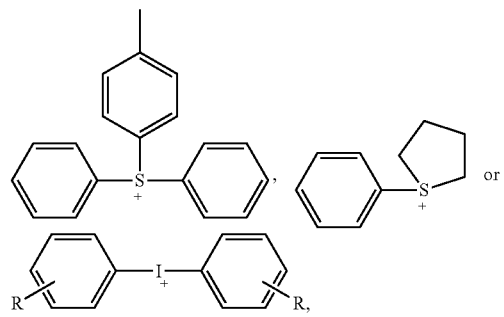

where R is independently H, a $C_{1-20}$ alkyl, a $C_{6-20}$ aryl, or a $C_{6-20}$ alkyl aryl, and the anion is

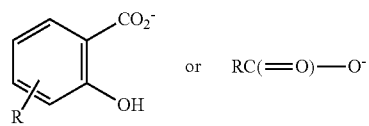

where R is independently H, a $C_{1-20}$ alkyl, a $C_{1-20}$ alkoxy, a $C_{6-20}$ aryl, or a $C_{6-20}$ alkyl aryl. Other photo-destroyable bases include those based on non-ionic photo-decomposing chromophores such as, for example, 2-nitrobenzyl groups and benzoin groups. An exemplary photobase generator is ortho-nitrobenzyl carbamate.

Alternatively, or in addition, other additives may include quenchers that are non-photo-destroyable bases, such as, for example, those based on hydroxides, carboxylates, amines, imines, and amides. Preferably, such quenchers include $C_{1-30}$ organic amines, imines, or amides, or may be a $C_{1-30}$ quaternary ammonium salt of a strong base (e.g., a hydroxide or alkoxide) or a weak base (e.g., a carboxylate). Exemplary quenchers include amines such as Troger's base, a hindered amine such as diazabicycloundecene (DBU) or diazabicyclononene (DBM), or ionic quenchers including quaternary alkyl ammonium salts such as tetrabutylammonium hydroxide (TBAH) or tetrabutyl ammonium lactate.

Surfactants include fluorinated and non-fluorinated surfactants, and are preferably non-ionic. Exemplary fluorinated non-ionic surfactants include perfluoro $C_4$ surfactants such as FC-4430 and FC-4432 surfactants, available from 3M Corporation; and fluorodiols such as POLYFOX PF-636, PF-6320, PF-656, and PF-6520 fluorosurfactants from Omnova.

The photoresist further includes a solvent generally suitable for dissolving, dispensing, and coating the components used in a photoresists. Exemplary solvents include anisole, alcohols including ethyl lactate, 1-methoxy-2-propanol, and 1-ethoxy-2 propanol, esters including n-butylacetate, 1-methoxy-2-propyl acetate, methoxyethoxypropionate, ethoxyethoxypropionate, ketones including cyclohexanone and 2-heptanone, and a combination comprising at least one of the foregoing solvents.

The photoresist composition disclosed herein may include the copolymer in an amount of 50 to 99 wt %, specifically 55 to 95 wt %, more specifically 60 to 90 wt %, and still more specifically 65 to 90 wt % based on the total weight of solids. It will be understood that "copolymer" used in this context of a component in a photoresist may mean only the copolymer disclosed herein, or a combination of the copolymer with another polymer useful in a photoresist. The photo-destroyable base may be present in the photoresist in an amount of 0.01 to 5 wt %, specifically 0.1 to 4 wt %, and still more specifically 0.2 to 3 wt %, based on the total weight of solids. A surfactant may be included in an amount of 0.01 to 5 wt %, specifically 0.1 to 4 wt %, and still more specifically 0.2 to 3 wt %, based on the total weight of solids. A quencher may be included in relatively small amounts of for example, from 0.03 to 5 wt % based on the total weight of solids. Other additives may be included in amounts of less than or equal to 30 wt %, specifically less than or equal to 20%, or more specifically less than or equal to 10%, based on the total weight of solids. The total solids content for the photoresist composition may be 0.5 to 50 wt %, specifically 1 to 45 wt %, more specifically 2 to 40 wt %, and still more specifically 5 to 35 wt %, based on the total weight of solids and solvent. It will be understood that the solids includes copolymer, photo-destroyable base, quencher, surfactant, any added PAG, and any optional additives, exclusive of solvent.

A coated substrate may be formed from the photoresist containing the polymer-bound PAG. Such a coated substrate includes: (a) a substrate having one or more layers to be patterned on a surface thereof; and (b) a layer of the photoresist composition including the polymer-bound PAG over the one or more layers to be patterned.

Substrates may be any dimension and shape, and are preferably those useful for photolithography, such as silicon, silicon dioxide, silicon-on-insulator (SOI), strained silicon, gallium arsenide, coated substrates including those coated with silicon nitride, silicon oxynitride, titanium nitride, tantalum nitride, ultrathin gate oxides such as hafnium oxide, metal or metal coated substrates including those coated with titanium, tantalum, copper, aluminum, tungsten, alloys thereof, and combinations thereof. Preferably, the surfaces of substrates herein include critical dimension layers to be patterned including, for example, one or more gate-level layers or other critical dimension layer on the substrates for semiconductor manufacture. Such substrates may preferably include silicon, SOI, strained silicon, and other such substrate materials, formed as circular wafers having dimensions such as, for example, 20 cm, 30 cm, or larger in diameter, or other dimensions useful for wafer fabrication production.

Further, a method of forming an electronic device includes (a) applying a layer of a photoresist composition including on a surface of the substrate; (b) patternwise exposing the photoresist composition layer to activating radiation; and (c) developing the exposed photoresist composition layer to provide a resist relief image.

Applying may be accomplished by any suitable method, including spin coating, spray coating, dip coating, doctor blading, or the like. Applying the layer of photoresist is preferably accomplished by spin-coating the photoresist in solvent using a coating track, in which the photoresist is dispensed on a spinning wafer. During dispense, the wafer may be spun at a speed of up to 4,000 rpm, preferably from about 500 to 3,000 rpm, and more preferably 1,000 to 2,500 rpm. The coated wafer is spun to remove solvent, and baked on a hot plate to remove residual solvent and free volume from the film to make it uniformly dense.

Patternwise exposure is then carried out using an exposure tool such as a scanner or stepper, in which the film is irradiated through a pattern mask and thereby is exposed patternwise. The method preferably uses advanced exposure tools generating activating radiation at wavelengths capable of high resolution including extreme-ultraviolet (EUV) or e-beam radiation. It will be appreciated that exposure using the activating radiation decomposes the PAG in the exposed areas and generates acid and decomposition by-products, and that the acid then effects a chemical change in the polymer (deblocking the acid sensitive group to generate a base-soluble group, or alternatively, catalyzing a cross-linking reaction in the exposed areas). The resolution of such exposure tools may be less than 30 nm.

Developing the exposed photoresist layer is then accomplished by treating the exposed layer to a suitable developer capable of selectively removing the exposed portions of the film (where the photoresist is positive tone) or removing the unexposed portions of the film (where the photoresist is crosslinkable in the exposed regions, i.e., negative tone). Preferably, the photoresist is positive tone based on a polymer having acid sensitive (deprotectable) groups, and the developer is preferably a metal-ion free tetraalkylammonium hydroxide solution, such as, for example, aqueous 0.26 N tetramethylammonium hydroxide. A pattern forms by developing.

The photoresist may, when used in one or more such a pattern-forming processes, be used to fabricate electronic and optoelectronic devices such as memory devices, processor chips (CPU's), graphics chips, and other such devices.

The invention is further illustrated by the following examples. All compounds and reagents used herein are available commercially except where a procedure is provided below.

Structural characterization was carried out by nuclear magnetic resonance (NMR) spectrometry on a VNMRS 500 NMR Spectrometer (operating at 500 MHz for proton) or 400-MR NMR Spectrometer (operating at 400 MHz for proton), each from Varian. Polymer composition was determined by quantitative $^{13}C$ NMR at 125 MHz or 100 MHz using NOE suppression techniques (i.e., Cr(acetylacetonate)$_3$ and a pulse delay of >2 seconds). Molecular weight (Mw) and polydispersity (PD) were determined by gel permeation chromatography (GPC) using a sample concentration of 2 mg/ml and a crosslinked styrene-divinylbenzene column with universal calibration curve calibrated with polystyrene standards, and eluted with tetrahydrofuran at a flow rate of 1 ml/min.

Glass transition temperature was determined by differential scanning calorimetry using a calorimeter operating with a ramp rate of 10° C. per minute (second heat). Unless otherwise specified, all monomers, solvents, and reagents used herein are available commercially.

Water contact angle was measured using a Kruss water contact angle goniometer.

EUV transmittance calculations were performed using the calculator available on the website for the Center for X-Ray Optics (CXRO) at Lawrence Berkeley National Laboratory (http://henkle.lbl.gov/optical_constants/filter2.html). Chemical formulae were calculated using the following equation (I) where $n_p$ is the atom count of an element in the polymer, $n_i$ the atom count of the $i^{th}$ monomer, and $X_i$ is the mole fraction of the $i^{th}$ monomer in the polymer:

$$n_p = 100 \, \Sigma_i X_i n_i \quad (I)$$

The polymer chemical formula was entered into the website along with an assumed density of 1.2 g/mL and a film thickness of 0.040 microns. The calculation was performed for a range of 13 to 14 nm wavelength light in 10 steps. The result for 13.4 nm wavelength transmittance is used for the EUV transmittance values discussed herein.

Fluorinated monomers used to prepare the copolymer examples include tert-butyl trifluoromethacrylate (TBTFMA), and 3,5-dihexafluoroalcoholtrifluoromethacrylate (di-HFATFMA):

TBTFMA

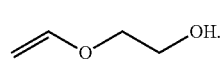

di-HFATFMA

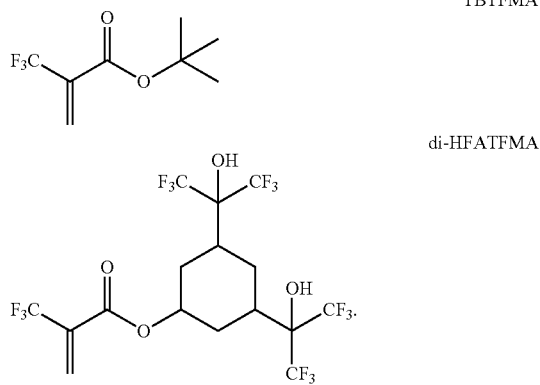

Also, the cyclic vinyl ether used is 2,3-dihydrofuran (DHF) along with acyclic vinyl ethers ethyl vinyl ether (EVE), anthracene-9-carboxylic acid ethylene glycol vinyl ether (AcVE), adamantyl carboxylic acid ethylene glycol vinyl ether (AdVE) and ethylene glycol vinyl ether (EGVE):

DHF

EVE

AcVE

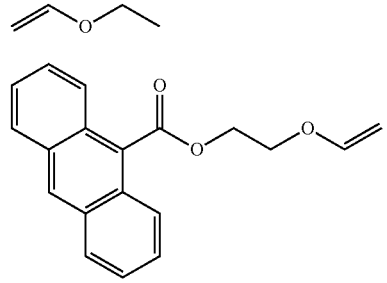

AdVE

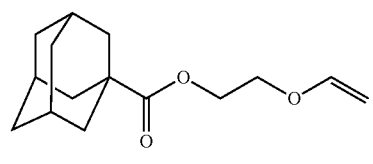

EGVE

The polymers of Comparative Examples 1-5 and Examples 1-5 were prepared and evaluated as follows. Batch polymerizations were run with an initial cyclic vinyl ether (dihydrofuran) loading of 50 mol % of the total monomer. The remaining 50 mol % of monomers was divided between TBTFMA and di-HFATFMA.

Poly(TBTFMA-co-DHF) (Comparative Example 1) was prepared as follows. A solution of TBTFMA (10.0 g, 51.0 mmol) and DHF (3.57 g, 51.0 mmol) was prepared in 10.0 g of propylene glycol monomethyl ether acetate (PGMEA) in a 100 mL vessel, and a solution of Wako V-601 initiator (2.35 g, 10.2 mmol) was prepared in 3.5 g of PGMEA. The monomer solution was heated to 60° C. followed by addition of the initiator solution. After four hours, the reaction mixture was cooled to room temperature and precipitated in 200 mL of an 80/20 (v/v) methanol/water mixture to form a white powder. The powder was filtered and dissolved in 20 g of tetrahydrofuran (THF) to form a clear solution. The polymer was reprecipitated in 200 mL of a 90/10 (v/v) methanol/water mixture to form a white powder. The polymer was collected by filtration, and the resultant white powder was dried for 18 hours in a 60° C. vacuum oven. The yield of the polymer was 8.08 g (59.5% yield). GPC analysis showed a Mw of 6378 with a PDI of 1.38. Tg=96° C.

Poly(TBTFMA-co-di-HFATFMA-co-DHF) (Comparative Examples 2-5) was prepared by the following general method for a representative example (Comparative Example 2) having a target molar composition of TBTFMA/di-HFATFMA/DHF 40/10/50.

A solution of TBTFMA (6.96 g, 35.5 mmol), di-HFATFMA (5.00 g, 9.01 mmol), and DHF (3.11 g, 44.4 mmol) was prepared in 10.0 g of propylene glycol monomethyl ether acetate (PGMEA) in a 100 mL vessel, and a solution of Wako V-601 initiator (2.04 g, 8.84 mmol) was prepared in 5 g of PGMEA. After the monomer solution was heated to 60° C., the initiator solution was added. After four hours the reaction mixture was cooled to room temperature and precipitated from 200 mL of a 80/20 (v/v) mixture of methanol/water to form a sticky white solid. The precipitation solvent was decanted, and the solid was dissolved in 20 g of tetrahydrofuran (THF). The resulting clear solution was precipitated from 200 mL of an 80/20 (v/v) mixture of methanol/water to yield a white solid that was collected by filtration. The polymer was dried for 18 hours in a 60° C.

vacuum oven. The yield of the dried polymer was 9.06 g (60.1% yield). GPC analysis showed a Mw of 5989 with a PDI of 1.40. Tg=119° C.

Other compositions (Comparative Examples 3-5) were prepared by the same method but with the monomer ratios summarized in Table 1.

Poly(TBTFMA-co-AdVE) (Comparative Examples 6 and 7) were prepared as follows. A representative example (Comparative Example 6) is provided with a target molar composition of TBTFMA/AdEVE 50/50 at 23% initiator loading and 9% solids. A solution of TBTFMA (0.50 g, 2.5 mmol), AdVE (0.64 g, 2.5 mmol) was prepared in 10 mL of dry toluene and a solution of Wako V-601 (0.60 mg, 2.5 mmol) was prepared in 1.0 mL of toluene. After the monomer solution was heated to 65° C., the initiator solution was added. After heating for 18 hours, the reaction solution was cooled to room temperature and the crude reaction product was analyzed by GPC to give an Mw of 19,000 with a PDI of 1.61. Comparative Example 7 was prepared in a similar manner under more concentrated conditions with 31 mol % initiator loading and 58% solids.

Poly(TBTFMA-co-DHF-co-EVE) (Examples 6-9) was prepared by the following procedure. A representative example is provided with a target molar composition of TBTFMA/DHP/EVE 47.9/46.1/6.0 (Example 7). Other compositions (Examples 5-9) were prepared by the same method but with the monomer ratios summarized in Table 2.

A solution of TBTFMA (0.369 g, 1.88 mmol), DHF (0.127 g, 1.81 mmol), and EVE (16.8 mg, 0.223 mmol) was prepared in 0.4 g of PGMEA, and a solution of Wako V-601 initiator (85.3 mg, 0.370 mmol) was prepared in 0.1 g of PGMEA. After the monomer solution was heated to 60° C., the initiator solution was added and heat was maintained for 4 hours. The reaction was then allowed to cool to room temperature and the crude reaction product was analyzed by GPC to give an Mw of 6426 with a PDI of 1.61.

Poly(TBTFMA-co-di-HFATFMA-co-DHF-co-AcVE) (30/20/40/10) was prepared by the following procedure (Example 1). A solution was prepared of TBTFMA (2.62 g, 13.3 mmol), di-HFATFMA (4.89 g, 8.82 mmol), DHF (1.25 g, 17.9 mmol), AcVE (1.29 g, 4.41 mmol), and 8 g of PGMEA. Separately, a solution of Wako V-601 initiator (1.13 g, 4.90 mmol) was prepared in 2 g of PGMEA. The monomer solution was heated to 60° C., and then the initiator solution was added to the monomer solution. After four hours, the reaction mixture was cooled to room temperature. Then it was precipitated from 200 mL of an 80/20 (v/v) mixture of methanol/water to yield a sticky, white solid. The solid was dissolved in 10 mL of THF and precipitated a second time from the methanol/water mixture. The resulting white solid was collected by filtration and dried for 18 hours in a 60° C. vacuum oven. The yield of dried polymer was 4.70 g (47%), and GPC analysis of the polymer found an Mw of 10231 with a PDI of 1.56.

Preparation of poly(TBTFMA-co-di-HFATFMA-co-DHF-co-AdVE) (30/20/40/10) was prepared by the following procedure (Example 2). A solution was prepared consisting of TBTFMA (1.33 g, 6.80 mmol), di-HFATFMA (2.53 g, 4.56 mmol), DHF (0.637 g, 9.09 mmol), AdVE (0.584 g, 2.33 mmol), and 4 g of PGMEA. Separately, a solution of V-601 initiator (0.516 g, 2.24 mmol) in 1 g of PGMEA was prepared. The monomer solution was heated to 60° C., and then the initiator solution was added. After four hours, the reaction mixture was cooled to room temperature. Then it was precipitated from 100 mL of a 80/20 (v/v) mixture of methanol/water to yield a sticky, white solid. The solid was dissolved in 6 mL of THF and precipitated a second time from the methanol/water mixture. The resulting white solid was isolated by filtration and dried for 18 hours in a 60° C. vacuum oven. The yield of dried polymer was 4.0 g (80% yield), and GPC analysis of the polymer found an Mw of 12510 with a PDI of 1.59.

Poly(TBTFMA-co-di-HFATFMA-co-DHF-co-AdVE-co-EGVE) (30/20/40/8/2)(Example 3) was prepared by the following procedure. A solution of TBTFMA (1.34 g, 6.83 mmol), di-HFATFMA (2.53 g, 4.56 mmol), DHF (0.634 g, 9.05 mmol), AdVE (0.456 g, 1.82 mmol), EGVE (39.0 mg, 0.442 mmol), V-601 initiator (0.547 g, 2.37 mmol), and 5 g of PGMEA was prepared in a 20 mL vial. A small magnetic stirbar was added, and the vial was placed in a 60° C. heating block and stirred for three hours. Then, the reaction was cooled to room temperature and precipitated from an 80:20 (v/v) mixture of methanol and water. The resulting sticky, white solid was dissolved at approximately 50 wt % in THF and precipitated a second time from 80/20 (v/v) methanol/water. The resulting white solids were dried overnight in a 60° C. vacuum oven. The yield of dried polymer was 3.00 g (60% yield), and GPC analysis of the polymer found an Mw of 13,636 with a PDI of 1.62.

Poly(TBTFMA-co-di-HFATFMA-co-DHF-co-AdVE-co-EGVE) (30/20/40/5/5) (Example 4) was prepared by the following procedure. A solution of TBTFMA (1.42 g, 7.21 mmol), di-HFATFMA (2.60 g, 4.68 mmol), DHF (0.660 g, 9.41 mmol), AdVE (0.307 g, 1.23 mmol), EGVE (0.107 g, 1.21 mmol), and 4 g of PGMEA was prepared. Separately, V-601 initiator (0.547 g, 2.37 mmol) was mixed with 1 g of PGMEA to form a clear solution. The two solutions were mixed together in a 20 mL vial with a small magnetic stirbar, and the vial was placed in a 60° C. heating block for three hours. Then, the reaction was cooled to room temperature and precipitated from an 80/20 (v/v) mixture of methanol and water. The resulting sticky, white solids were dissolved at approximately 50 wt % in THF, and the polymer was precipitated again from 80/20 (v/v) methanol/water. The resulting white solids were dried overnight in a 60° C. vacuum oven. The yield of dried polymer was 2.54 g (51.0% yield), and GPC analysis showed an Mw of 14,321 with a PDI of 1.59.

Preparation of poly(TBTFMA-co-di-HFATFMA-co-DHF-co-EGVE) (30/20/40/10) (Example 5) was prepared by the following procedure. A solution of TBTFMA (1.43 g, 7.28 mmol), di-HFATFMA (2.68 g, 4.84 mmol), DHF (0.688 g, 9.82 mmol), EGVE (0.219 g, 2.48 mmol), and 4 g PGMEA was prepared. Separately, V-601 initiator (0.547, 2.37 mmol) was mixed with 1 g of PGMEA, and this solution was added to the monomer solution in a 20 mL vial with a small magnetic stirbar. The reaction vial then was placed in a 60° C. heating block and stirred for three hours. Then the reaction was cooled to room temperature and precipitated from an 80/20 (v/v) mixture of methanol and water. The resulting sticky, white solid was dissolved at approximately 50 wt % in THF and precipitated again from 80/20 (v/v) methanol/water. The resulting white solid was dried overnight in a 60° C. vacuum oven. The dried polymer yield was 1.05 g (21.0% yield), and the GPC analysis showed an Mw of 14,947 with a PDI of 1.61.

A series of polymers with increasing levels of di-HFATFMA (0, 10, 15, 20, and 30 mol % relative to the other monomers) are shown in the Comparative Examples 1-5 in Table 1, below. Examples 1-5 include both DHF and a non-cyclic vinyl ether (AcVE or AdVE). Note that "N.D." as used in the tables below means "Not Determined".

TABLE 1

| Examples | Monomers | Monomer Mol Ratio | Yield (%) | Mw (g/mol) | PDI (Mw/Mn) | % T (40 nm) | Tg (° C.) |
|---|---|---|---|---|---|---|---|
| CEx. 1 | TBTFMA/DHF | 50/50 | 80.8 | 6378 | 1.38 | 78 | 96 |
| CEx. 2 | TBTFMA/di-HFATFMA/DHF | 40/10/50 | 60.4 | 8392 | 1.40 | 76 | 119 |
| CEx. 3 | TBTFMA/di-HFATFMA/DHF | 35/15/50 | 66.7 | 7281 | 1.50 | 75 | 112 |
| CEx. 4 | TBTFMA/di-HFATFMA/DHF | 30/20/50 | 46.7 | 10326 | 1.43 | 74 | 150 |
| CEx. 5 | TBTFMA/di-HFATFMA/DHF | 20/30/50 | 41.3 | 11783 | 1.58 | 73 | N.D. |
| CEx. 6 | TBTFMA/AdVE | 50/50 | N.D. | 19000 | 1.61 | N.D. | N.D. |
| CEx. 7 | TBTFMA/AdVE | 50/50 | N.D. | 104000 | 2.70 | N.D. | N.D. |
| CEx. 8 | HS/STY/TBA | 65/20/15 | N.D. | N.D. | N.D. | 85 | N.D. |
| CEx. 9 | Methacrylate polymer/PAG | — | N.D. | N.D. | N.D. | 80 | N.D. |
| Ex. 1 | TBTFMA/di-HFATFMA/DHF/AcVE | 30/20/40/10 | 47.0 | 10231 | 1.56 | 75 | 119 |
| Ex. 2 | TBTFMA/di-HFATFMA/DHF/AdVE | 30/20/40/10 | 80.0 | 12510 | 1.59 | 75 | 118 |
| Ex. 3 | TBTFMA/di-HFATFMA/DHF/AdVE/EGVE | 30/20/40/8/2 | 59.9 | 13636 | 1.62 | 75 | 113 |
| Ex. 4 | TBTFMA/di-HFATFMA/DHF/AdVE/EGVE | 30/20/40/5/5 | 50.8 | 14321 | 1.59 | 75 | N.D. |
| Ex. 5 | TBTFMA/di-HFATFMA/DHF/AdVE | 30/20/40/10 | 20.9 | 14947 | 1.61 | 74 | N.D. |

As seen in the above data, each of CEx. 1-5 and Ex. 1-5 show molecular weights of less than 15,000 g/mol, and glass transition temperatures of 119 to 150° C. were obtained for CEx. 2-4, which indicate that increased cyclic vinyl ether content appears to increase the glass transition temperature.

Comparative Examples 6 and 7 show comparative high molecular weight polymers prepared without inclusion of a cyclic vinyl ether comonomer. While the polymer prepared in CEx. 6 has an Mw of less than 20,000 g/mol, high dilution with solvent (9 wt % monomers in solution) was necessary to obtain this result due to low solubility. Concentrations of 58 wt % monomers in solution yielded a polymer with a Mw greater than 100,000 g/mol.

Comparative Example 8 (Table 1) shows the EUV transmittance calculated for a typical parahydroxystyrene (p-HS), styrene (STY), tert-butyl acrylate (TBA) terpolymer. The transmittance of 85% is much greater than the EUV transmittance of polymers from Examples 1 through 5, demonstrating the enhanced capability of the composition to capture EUV photons relative to general commercial chemically amplified resists materials.

In addition, Comparative Example 9 shows the % T of a methacrylate polymer (A) (2-phenylpropyl methacrylate (PPMA), alpha(gammabutyrolactone) methacrylate (a-GBLMA), 3,5-bis(1,1,1,3,3,3-hexafluoro-2-hydroxyisopropyl)cyclohexyl methacrylate (di-HFAMA), and phenyl dibenzothiophenium 1,1-difluoro-4-(methacryloyloxy)ethan-1-sulfonate (PDT-2F MA), 34:43:9:6 molar ratio, which is representative of a typical methacrylate-based photoresist polymer, blended in a 92:8 ratio by weight with a photoacid generator (B).

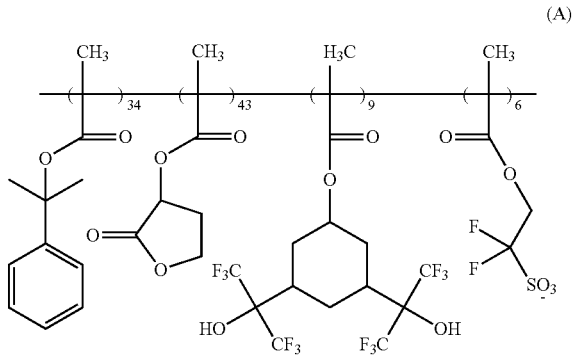

(A)

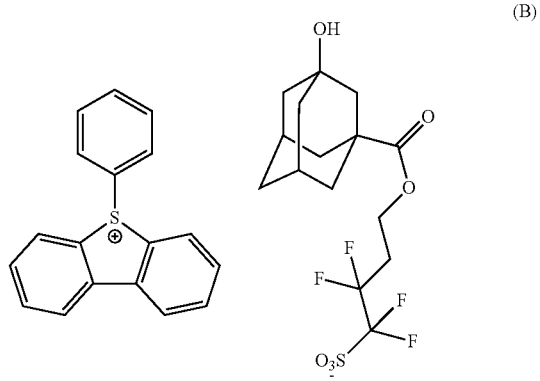

(B)

-continued

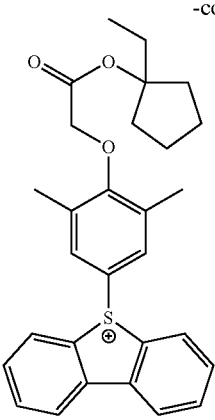

As seen in Table 1, the combination of methacrylate polymer and PAG has a higher % T at 40 nm (80%) than the exemplary polymers, indicating the improved absorbance and sensitivity conveyed by the inclusion of fluorine groups into the polymer backbone.

Polymerization of TBTFMA were also carried out using varying ratios of EVE as a non-cyclic vinyl ethers (NCVE) and DHF as a cyclic vinyl ether (CVE) to determine what effect if any of NCVE loading would be tolerated while maintaining low molecular weight (Mw and Mn) and PDI. Table 2 summarizes four polymers (Examples 6-9) prepared with 0 to 20 mol % of non-cyclic vinyl ether. It has been found that the increase in Mw as the mole fraction of non-cyclic vinyl ether (NCVE, i.e., EVE) increases in the monomer feed.

Also in Table 2, it can be seen that variation in initiator (Wako V-601) loading shows no apparent correlation of increasing Mw with increasing initiator loading within the four polymerizations run. However, inclusion of 10 mol % or more of a non-cyclic vinyl ether provides a polymer Mw below 15,000 g/mol, while maintaining a PDI (Mw/Mn) of less than 2.

TABLE 2

| Example | TBTFMA (%) | DHF (%) | EVE (%) | Initiator (%) | Mw (g/mol) | PDI (Mw/Mn) |
| --- | --- | --- | --- | --- | --- | --- |
| Ex. 6 | 46.4 | 53.6 | 0 | 9.7 | 4937 | 1.53 |
| Ex. 7 | 47.9 | 46.1 | 6.0 | 9.5 | 6426 | 1.61 |
| Ex. 8 | 46.9 | 36.6 | 16.5 | 9.7 | 10851 | 1.70 |
| Ex. 9 | 50.0 | 30.5 | 19.5 | 10.2 | 12814 | 1.82 |

The polymers having 10 mol % of a vinyl ether monomer containing either AcVE or AdVE (Ex. 1 and 2, respectively, in Table 1) were prepared based on the data of Table 2, to obtain polymers with molecular weights (Mw) of less than 15,000 for a lithographically useful polymer. AcVE and AdVE are each more hydrophobic as each contains fused aromatic rings (AcVE) and alicyclic rings (AdVE). These monomers were included to provide improved etch resistance and film coat quality for a photoresist formulated from the polymers of Ex. 1 and 2.

Dissolution rate and lithographic evaluations of the polymers were carried out by the following procedures.

The general procedure for preparing a positive tone photoresist composition is as follows. A mixture of 0.054 g of Comparative Polymer 1-5 or Examples 1-5, 0.011 g of a 1 wt % solution of Omnova PF656 surfactant in propylene glycol monomethyl ether acetate, 0.054 of a 1 wt % solution of base additive (TMA-OHBA) in ethyl lactate, 0.161 g of a 5 wt % solution of 4-hydroxyphenyldiphenylsulfonium cyclo (1,3-perflouropropanedisulfonyl)imide salt in propylene glycol monomethyl ether acetate, 1.489 of ethyl lactate and 0.731 g of hydroxy methyl isobutyrate (HBM) were thoroughly mixed to dissolve the solids and filtered through a 0.1 μm filter.

Each comparative and exemplary photoresist was lithographically processed as follows. The photoresist was spin-coated using a TEL ACT-8 coating track (Tokyo Electron) onto a 200 mm silicon wafer with a commercially available organic underlayer (AR9, available from Dow Electronic Materials) and post-apply baked at 90° C. for 60 seconds to form a photoresist film of about 60 nm in thickness. The resulting photoresist layer was flood exposed using an $E_0$ array using an EUV-ES 9000 LTJ tool (EUV radiation, 13.4 nm) or an Canon ES-4 KrF tool (248 nm). Lithographic evaluations at EUV wavelengths were obtained using the eMET tool at Lawrence Berkeley Laboratories, for 1:1 lines/spaces at 28 nm half pitch. The patterned wafers were post exposure baked at temperatures from 70-90° C. and the image pattern developed with 0.26 N aqueous tetramethylammonium hydroxide developer solution to form a positive-tone photoresist pattern.

Formulations were prepared in this way from the polymers of CEx. 1-5 and Ex. 1 and 2, and tested for water contact angle (spin quality and unexposed film dissolution rate (developer strip) in 0.26 N tetramethylammonium hydroxide developer. Water contact angle, developer strip, and dose-to-clear at 248 nm and EUV wavelengths are summarized in Table 3, below.

TABLE 3

| | % T | Water Contact | Developer | $E_0$ (mJ/cm$^2$) | |
| --- | --- | --- | --- | --- | --- |
| Example | 40 nm | Angle | Strip (Å) | KrF | EUV |
| CEx. 1 | 77.78 | poor spin coat quality | | | |
| CEx. 2 | 75.67 | N.D. | 0 | 27 | 3.4 |
| CEx. 3 | 74.93 | 86 | 2 | 21 | 2.4 |
| CEx. 4 | 74.32 | 83 | 2 | 19 | 3.0 |
| CEx. 5 | 73.39 | N.D. | high developer strip | | |
| Ex. 1 | 75.26 | 76 | 2 | 15.5 | 2.0 |
| Ex. 2 | 75.06 | 77 | 0 | >50 | 2.0 |
| Ex. 3 | 74.86 | 76.5 | N.D. | N.D. | N.D. |
| Ex. 4 | 74.69 | 77 | N.D. | N.D. | N.D. |
| Ex. 5 | 74.34 | 76.5 | N.D. | N.D. | N.D. |

The results for coat quality and water contact angle and developer strip show that CEx. 1 and 5 had very poor spin coat quality and/or very high developer strip, respectively, and were not tested further.

Water contact angle for the photoresist films was high (76° or higher), and the spin coat quality improved and the developer strip (as measured by film loss in angstroms) increased as hydrophilic groups were incorporated into the polymer to decrease the contact angle (and improve wettability). The addition of hydrophilic groups also tended to increase both KrF and EUV photospeed. All of the resists tested by EUV have fast photospeeds with $E_0$ values of less than 3.5 mJ/cm$^2$.

Figure 2:
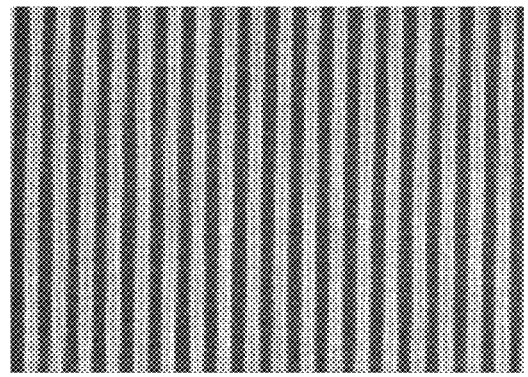
FIG. 2 shows an SEM image of a developed EUV lithographic image of a 38 nm half pitch line-space pattern for an exemplary copolymer exposed at 10.32 mJ/cm².

A contrast curve for the photoresist (FIG. 1) which incorporates the polymer of Example 1 illustrates the fast photospeed of these materials. The photoresist of Example 1 shows extremely rapid deprotection at doses beginning at less than 2 mJ/cm$^2$. A top-down SEM of a photoresist of Example 1 (FIG. 2) illustrates the ability to image patterns in this representative material by EUV lithography at an exposure dose of 10.32 mJ/cm².

Figure 3:
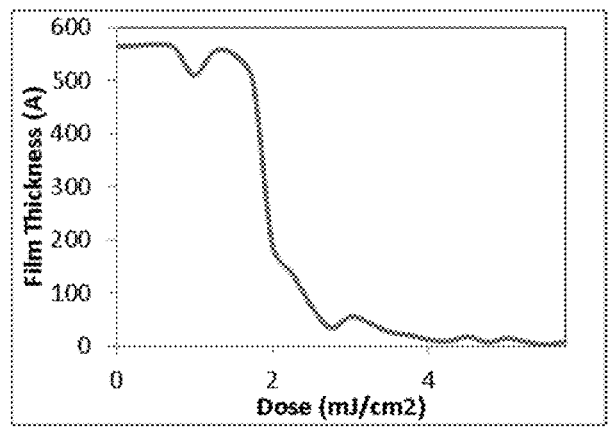
FIG. 3 shows and extreme ultraviolet (EUV) contrast curve as a plot of measured film thickness (nm) versus exposure dose (in mJ/cm²) for a second exemplary copolymer.

A contrast curve for the photoresist (FIG. 3) which incorporates the polymer of Example 1 illustrates the fast photospeed for a second representative material. The photoresist of Example 2 shows rapid deprotection at does beginning at less than 2 mJ/cm².

All ranges disclosed herein are inclusive of the endpoints, and the endpoints are independently combinable with each other. The suffix "(s)" as used herein is intended to include both the singular and the plural of the term that it modifies, thereby including at least one of that term. "Optional" or "optionally" means that the subsequently described event or circumstance can or cannot occur, and that the description includes instances where the event occurs and instances where it does not. As used herein, "combination" is inclusive of blends, mixtures, alloys, or reaction products. All references are incorporated herein by reference.

The use of the terms "a" and "an" and "the" and similar referents in the context of describing the invention (especially in the context of the following claims) are to be construed to cover both the singular and the plural, unless otherwise indicated herein or clearly contradicted by context. Further, it should further be noted that the terms "first," "second," and the like herein do not denote any order, quantity, or importance, but rather are used to distinguish one element from another.

The invention claimed is:

1. A copolymer, comprising the polymerized product of:
a dissolution-rate controlling monomer having the formula (I), an acyclic vinyl ether of the formula (II), and a cyclic vinyl ether of the formula (III):

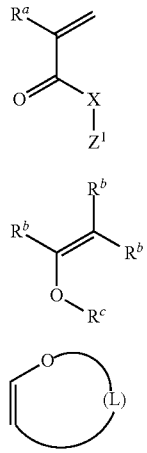

wherein $R^a$ is H, F, $C_{1-10}$ alkyl, or $C_{1-10}$ fluoroalkyl, provided $R^a$ is $C_{1-10}$ fluoroalkyl for at least one instance of the monomer of formula (I), X is O or NR wherein R is H, a $C_{1-10}$ alkyl, or a $C_{6-10}$ aryl, $Z^1$ is a $C_{1-20}$ alkyl, $C_{3-20}$ cycloalkyl, $C_{6-20}$ aryl, or $C_{7-20}$ aralkyl, each optionally substituted with hydroxyl, sulfonate, sulfonic acid, sulfonamide, sulfonimide, carboxylic acid, ester, carbonate, amide, or a combination thereof, each $R^b$ is independently H or a group selected from $C_{1-20}$ alkyl, $C_{3-20}$ cycloalkyl, $C_{6-20}$ aryl, or $C_{7-20}$ aralkyl wherein each group is optionally substituted with —F, or a combination thereof, wherein two or more of the foregoing groups are optionally linked with —C(=O)—O—, $R^c$ is a group selected from $C_{1-20}$ alkyl, $C_{3-20}$ cycloalkyl, $C_{6-20}$ aryl, or $C_{7-20}$ aralkyl wherein each $R^c$ group is optionally substituted with —F or —OH, or a combination thereof, wherein two or more of the foregoing groups are optionally linked with —O—, —S—, —NR—, or —C(=O)—O—, and L is a linear $C_{1-20}$ alkylene, $C_{1-20}$ alkylene-C(=O)*, $C_{3-20}$ cycloalkylene, $C_{6-20}$ arylene, or $C_{7-20}$ aralkylene each optionally substituted with —F, —OH, or a combination thereof, wherein * indicates a point of attachment of the $C_{1-20}$ alkylene-C(=O) to a double bond of the cyclic vinyl ether of the formula (III), and wherein an amount of the acyclic vinyl ether of the formula (II) is from greater than 0 mol % to 20 mol % based on the total monomer amount.

2. The copolymer of claim 1, wherein monomer (I) is a base soluble cycloalkyl monomer of formula (I-a), a hydroxyaromatic monomer of formula (I-b), an acid-deprotectable monomer of formula (I-c), or a combination thereof:

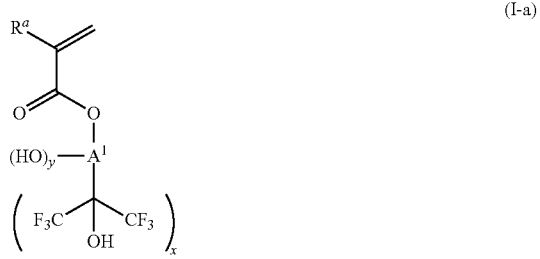

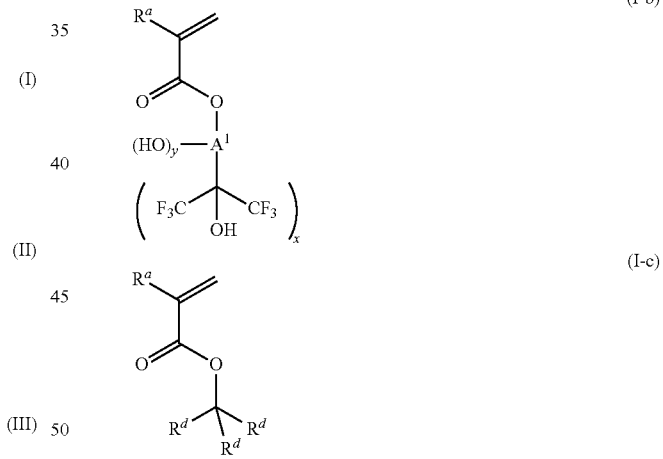

wherein $R^a$ is H, F, $C_{1-10}$ alkyl, or $C_{1-10}$ fluoroalkyl, provided $R^a$ is $C_{1-10}$ fluoroalkyl for at least one of monomer (I-a), (I-b), or (I-c),

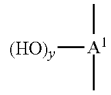

is an $(HO)_y$-substituted linear or branched $C_{1-20}$ alkylene, $(HO)_y$-substituted $C_{3-20}$ cycloalkylene, $(HO)_y$-substituted $C_{5-20}$ polycycloalkylene, or $(HO)_y$-substituted fused $C_{6-20}$ polycycloalkylene, wherein

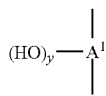

is optionally substituted with F,

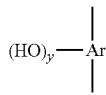

is an $(HO)_y$-substituted $C_{6-20}$ arylene, or $(HO)_y$-substituted $C_{7-20}$ aralkylene, wherein

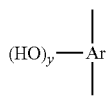

is optionally substituted with F, each $R^d$ is independently $C_{1-20}$ alkyl, $C_{3-20}$ cycloalkyl, $C_{6-20}$ aryl, or $C_{7-20}$ aralkyl, and each $R^d$ is only commonly attached to a single carbon atom or at least one $R^d$ is further bonded to an adjacent $R^d$ to form a cyclic structure, x is independently an integer of from 0 to 3, y is 0 or 1, and x+y>0.

3. The copolymer of claim 2, wherein the base soluble cycloalkyl monomer has formula (I-a-1) and the base soluble aromatic monomer has formula (I-b-1):

(I-a-1)

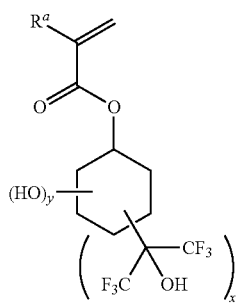

(I-b-1)

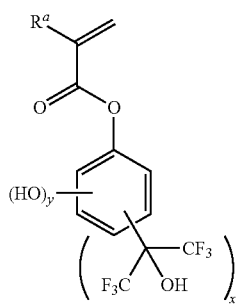

wherein each $R^a$ is independently $C_{1-10}$ fluoroalkyl,
x in (I-a-1) is an integer of from 1 to 3, y is 0 or 1, and
x in (I-b-1) is an integer of from 0 to 3, y is 0 or 1, and x+y>0.

4. The copolymer of claim 2, wherein the acid deprotectable monomer comprises:

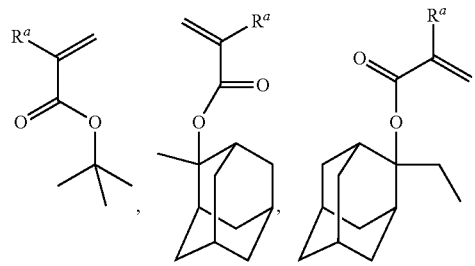

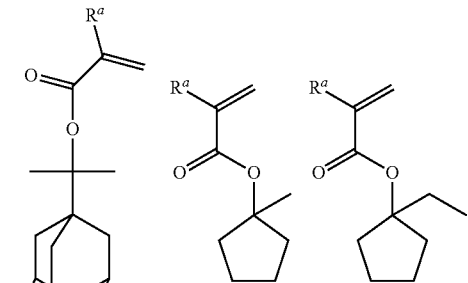

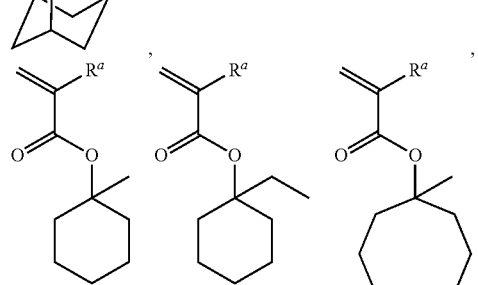

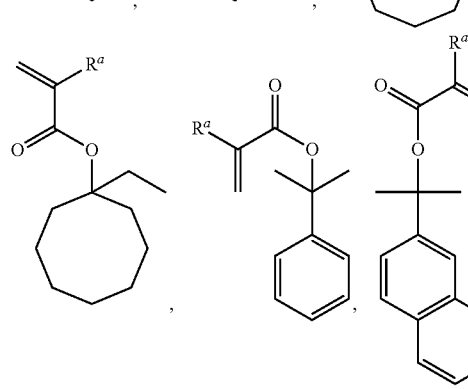

or a combination thereof, wherein $R^a$ is $C_{1-6}$ fluoroalkyl for at least one monomer, or where a combination of monomers is used, $R^a$ is H, F, $C_{1-6}$ alkyl, or $C_{1-6}$ fluoroalkyl, provided $R^a$ is $C_{1-6}$ fluoroalkyl for at least one monomer.

5. The copolymer of claim 1, wherein the acyclic vinyl ether of the formula (II) includes:

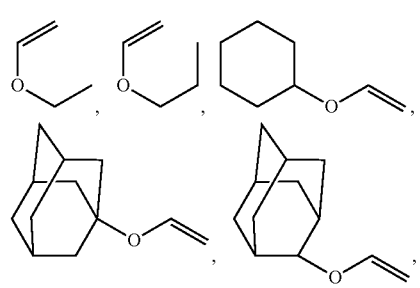

-continued
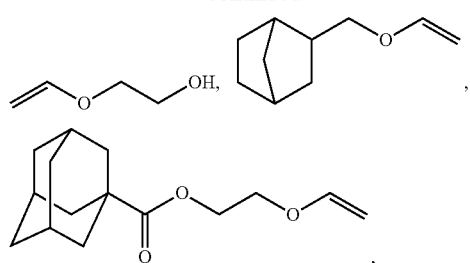
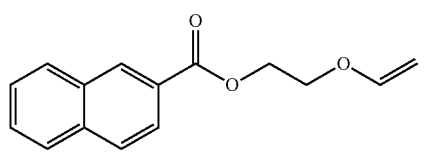
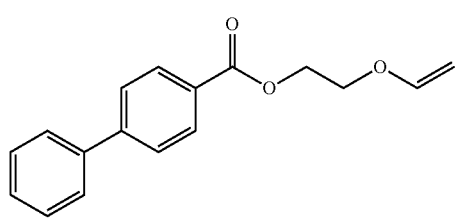
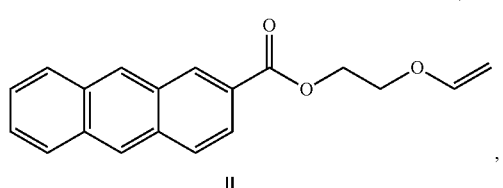
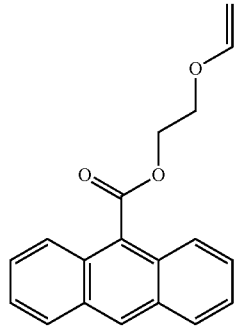
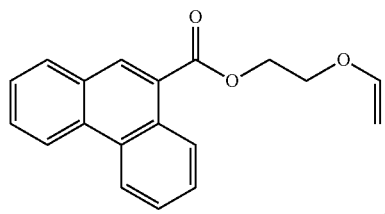
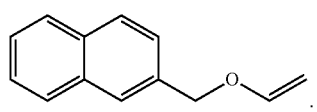
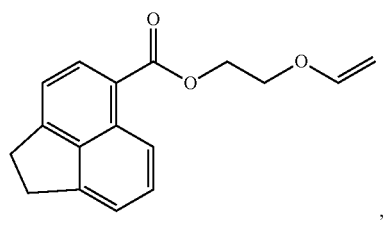
-continued
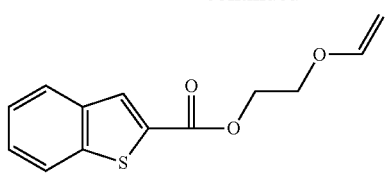
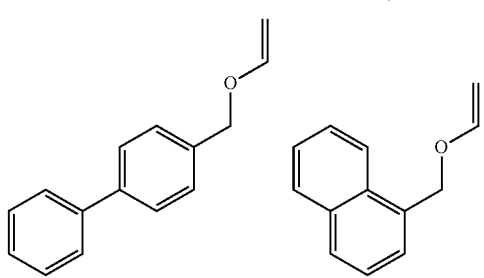
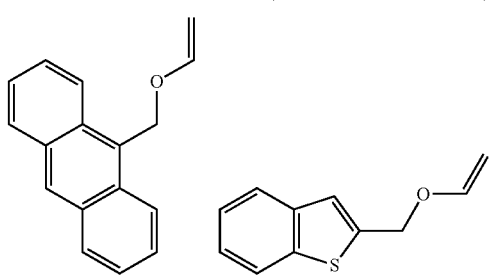
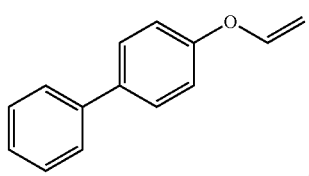
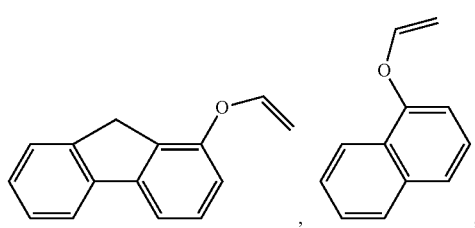
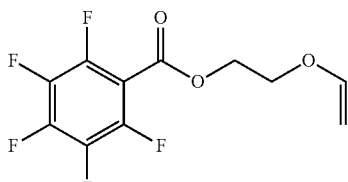
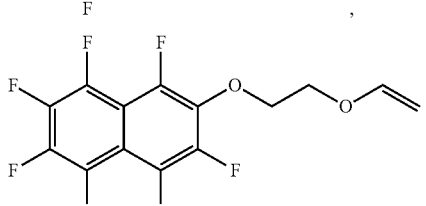
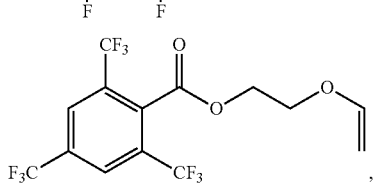

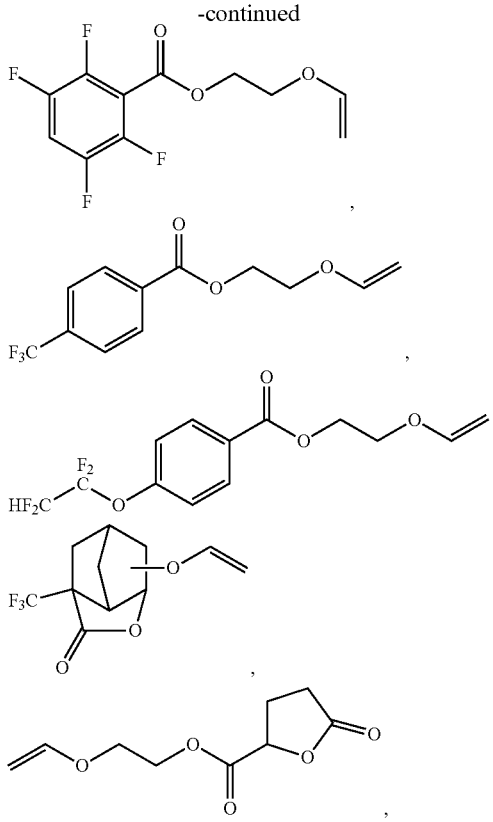

or a combination thereof.

6. The copolymer of claim 1, wherein the cyclic vinyl ether of the formula (III) comprises:

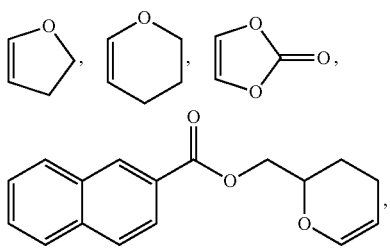

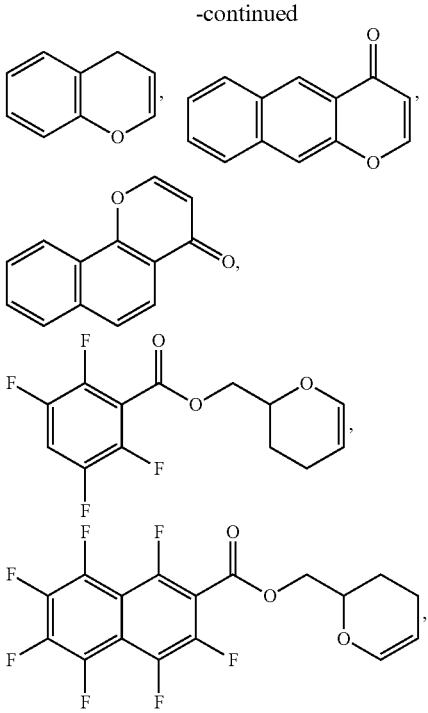

or a combination thereof.

7. A photoresist composition comprising the copolymer of claim 1, and a photoacid generator, wherein the photoacid generator is an additive or is incorporated into the copolymer.

8. A coated substrate, comprising: (a) a substrate having one or more layers to be patterned on a surface thereof; and (b) a layer of a photoresist composition of claim 7 over the one or more layers to be patterned.

9. A method of forming an electronic device, comprising: (a) applying a layer of a photoresist composition of claim 7 on a substrate; (b) patternwise exposing the photoresist composition layer to activating radiation; and (c) developing the exposed photoresist composition layer to provide a resist relief image.

10. The method of claim 9, wherein the radiation is extreme-ultraviolet or e-beam radiation.

* * * * *